(12) United States Patent
Otake et al.

(10) Patent No.: US 7,676,916 B2
(45) Date of Patent: Mar. 16, 2010

(54) ELECTRONIC COMPONENT MOUNTING SYSTEM AND ELECTRONIC COMPONENT MOUNTING METHOD

(75) Inventors: Yuji Otake, Fukuoka (JP); Toshitsugu Oba, Fukuoka (JP)

(73) Assignee: Panasonic Corporation, Osaka (JP)

( * ) Notice: Subject to any disclaimer, the term of this patent is extended or adjusted under 35 U.S.C. 154(b) by 281 days.

(21) Appl. No.: 11/814,041

(22) PCT Filed: Feb. 10, 2006

(86) PCT No.: PCT/JP2006/302779

§ 371 (c)(1),
(2), (4) Date: Jul. 16, 2007

(87) PCT Pub. No.: WO2006/088113

PCT Pub. Date: Aug. 24, 2006

(65) Prior Publication Data
US 2009/0007424 A1  Jan. 8, 2009

(30) Foreign Application Priority Data
Feb. 15, 2005 (JP) ............... 2005-037154

(51) Int. Cl.
*H05K 3/34* (2006.01)
(52) U.S. Cl. .............. 29/840; 29/712; 29/739; 29/740; 29/742; 29/743
(58) Field of Classification Search .......... 29/712, 29/739, 740, 742, 743, 840
See application file for complete search history.

(56) References Cited

U.S. PATENT DOCUMENTS 6,371,017 B1 * 4/2002 Yamazaki et al. ......... 101/129
2002/0083570 A1  7/2002 Inoue et al.
2004/0031406 A1 * 2/2004 Otake et al. ............ 101/129
2004/0146195 A1  7/2004 Fukagawa et al.
2005/0015975 A1 * 1/2005 Inoue et al. ............... 29/840

FOREIGN PATENT DOCUMENTS

| EP | 1239719 | 3/2002 |
|----|---------|--------|
| JP | 2002084097 | 3/2002 |
| JP | 2002-271096 A | 9/2002 |
| JP | 2004-039873 A | 2/2004 |
| JP | 2004-058298 A | 2/2004 |

OTHER PUBLICATIONS

Japanese Office Action dated Apr. 15, 2009.

* cited by examiner

*Primary Examiner*—Derris H Banks
*Assistant Examiner*—Azm Parvez
(74) *Attorney, Agent, or Firm*—Pearne & Gordon LLP (57) ABSTRACT

In an electronic component mounting method of mounting electronic components on a substrate by means of soldering by using an electronic component mounting system having a screen printing apparatus and an electronic component mounting apparatus connected to each other to manufacture a mounting substrate, prior to a screen printing process, the positions of pattern holes provided in a screen mask are measured to calculate mask aperture data, and the coordinates of a mounting position when a component mounting operation is performed by a mounting head are calculated, on the basis of the mask aperture data. In this way, it is possible to calculate the positional deviation of solder, without measuring the position of solder after printing whenever the solder is printed, and to prevent defects in mounting due to the positional deviation of solder, which results in high productivity.

8 Claims, 9 Drawing Sheets

ELECTRONIC COMPONENT MOUNTING SYSTEM AND ELECTRONIC COMPONENT MOUNTING METHOD

TECHNICAL FIELD

The present invention relates to an electronic component mounting system which mounts electronic components on a substrate and to an electronic component mounting method.

BACKGROUND ART

In recent years, with a reduction in the size of electronic components and an increase in mounting density, high positional accuracy has been demanded when electronic components are mounted on a substrate. When the electronic components are mounted by a method of mounting electronic components on cream solder printed on electrodes of a substrate and of soldering the electronic components by reflow, it is desirable to mount the electronic components in consideration of the operation thereof in the reflow process and to manage the positional accuracy.

Therefore, the following method has been proposed: the positions of solder printed on a substrate are measured prior to a component mounting operation, and electronic components are mounted on the positions of solder when the electronic components are mounted (for example, see Japanese Unexamined Patent Application Publication No. 2002-84097). According to this method, in the reflow process in which electronic components are connected to electrodes by melt solder, it is possible to mount the electronic components on the electrodes of the substrate, without damaging the self-alignment effect of the melt solder, and thus to prevent defects in mounting due to the positional deviation of solder.

However, in the technique disclosed in JP-A-2002-84097, since a design is performed for solder printing positions with respect to a number of electrodes formed on a substrate, it takes much time to measure the solder printing positions before a component mounting operation. As a result, tact-time required for the mounting operation is delayed, which makes it difficult to prevent defects in mounting due to the positional deviation of the printed solder and to achieve high productivity.

DISCLOSURE OF INVENTION

Accordingly, an object of the invention is to provide an electronic component mounting apparatus and an electronic component mounting method capable of preventing defects in mounting due to the positional deviation of printed solder and of achieving high productivity.

According to an aspect of the invention, there is provided an electronic component mounting system for mounting electronic components on a substrate by means of soldering to manufacture a mounting substrate. The electronic component mounting system includes a screen printing apparatus which prints solder on electronic component connecting electrodes provided on the substrate through pattern holes provided in a screen mask, by bringing the screen mask into contact with the substrate, by supplying paste on the screen mask, and by sliding a squeegee thereon; an electronic component mounting apparatus which picks up the electronic components from a component supply unit by using a mounting head and mounts them on the substrate having the solder printed thereon; a mask aperture measuring unit which measures the positions of the pattern holes provided in the screen mask and outputs the measured positions as mask aperture data; and a coordinate calculating unit which calculates coordinates of mounting positions when the mounting head mounts the electronic components, on the basis of the mask aperture data.

According to another aspect of the invention, there is provided an electronic component mounting method which mounts electronic components on a substrate by means of soldering to manufacture a mounting substrate by using an electronic component mounting system having a plurality of electronic component mounting apparatuses connected to each other. The electronic component mounting method includes: a screen printing step of printing solder on electronic component connecting electrodes which are provided on the substrate, through pattern holes provided in a screen mask, by bringing the screen mask into contact with the substrate, by supplying paste on the screen mask, and by sliding a squeegee thereon; an electronic component mounting step of picking up the electronic components from a component supply unit by using a mounting head to mount them on the substrate having the solder printed thereon; a mask aperture measuring step of measuring the positions of the pattern holes provided in the screen mask and of outputting the measured positions as mask aperture data; and a coordinate calculating step of calculating coordinates of mounting positions when the mounting head mounts the electronic components, on the basis of the mask aperture data. In this method, the mask aperture measuring step and the coordinate calculating step are performed prior to the screen printing step.

According to the invention, prior to a screen printing process, the positions of pattern holes provided in a screen mask are measured to obtain mask aperture data, and the coordinates of a mounting position when a mounting head mounts electronic components are calculated. In this way, it is possible to calculate the positional deviation of solder, without measuring the position of the printed solder whenever the solder is printed, which makes it possible to prevent defects in mounting due to the positional deviation of solder and to achieve high productivity.

BEST MODE FOR CARRYING OUT THE INVENTION

Hereinafter, preferred embodiments of the invention will be described with reference to the accompanying drawings.

Figure 1:
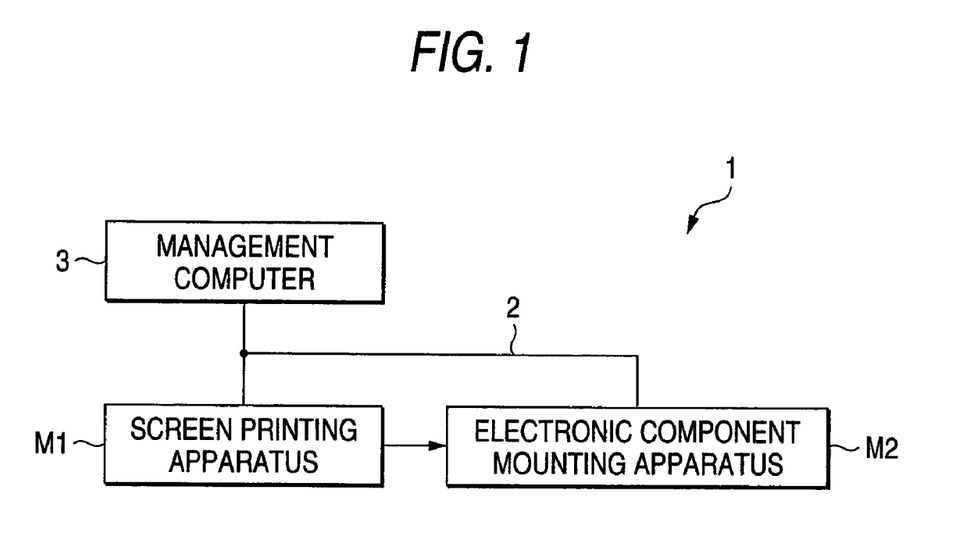
FIG. 1 is a block diagram illustrating the structure of an electronic component mounting system according to an embodiment of the invention.

First, the electronic component mounting system will be described with reference to FIG. 1. In the electronic component mounting system shown in FIG. 1, an electronic component mounting line 1 is formed by connecting a screen printing apparatus M1 and an electronic component mounting apparatus M2, and a management computer 3 is connected to the electronic component mounting line 1 by a communication network 2. In this way, the management computer 3 controls the entire system. Hereinafter, the structure of each apparatus will be described.

Figure 2:
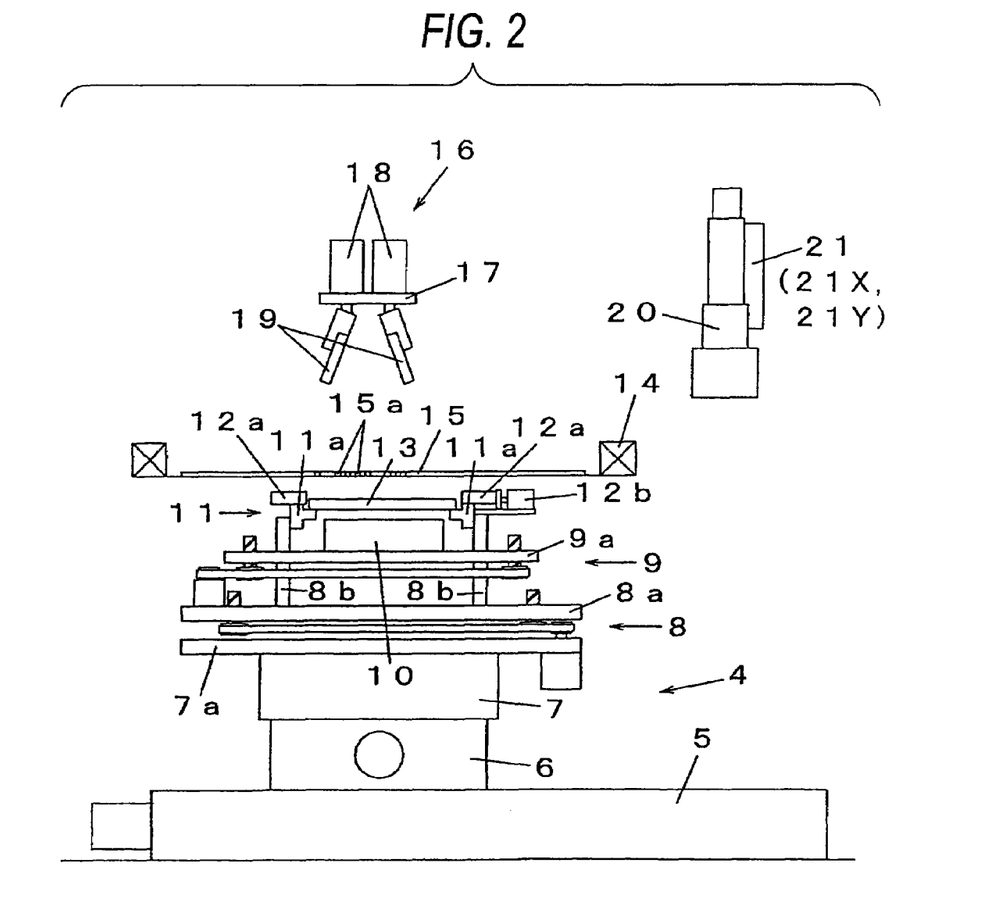
FIG. 2 is a side view illustrating a screen printing apparatus according to an embodiment of the invention.

Next, the structure of the screen printing apparatus will be described with reference to FIGS. 2 and 3. In the screen printing apparatus shown in FIG. 2, a screen printing mechanism is provided above a substrate positioning unit 4. In the substrate positioning unit 4, a Y-axis table 5, an X-axis table 6, and a θ-axis table 7 are laminated in this order, and a first Z-axis table 8 and a second Z-axis table 9 are mounted on a base plate 7a which is provided on the upper surface of the θ-axis table 7.

Further, a vertical frame 8b is provided on a base table 8a of the first Z-axis table 8, and a substrate transfer mechanism 11 is held at the top of the vertical frame 8b. The substrate transfer mechanism 11 includes two carrying rails 11a which are provided in parallel to a direction in which a substrate is carried (the X direction; a vertical direction to the plane of FIG. 2). Therefore, the substrate transfer mechanism 11 carries a substrate 13, which is a printing target, while supporting both ends of the substrate 13 with the carrying rails 11a. The driving of the first Z-axis table 8 makes it possible to raise or lower the carrying rails 11a and the substrate 13 supported by the carrying rails 11a, relative to a screen printing mechanism, which will be described later.

Figure 3:
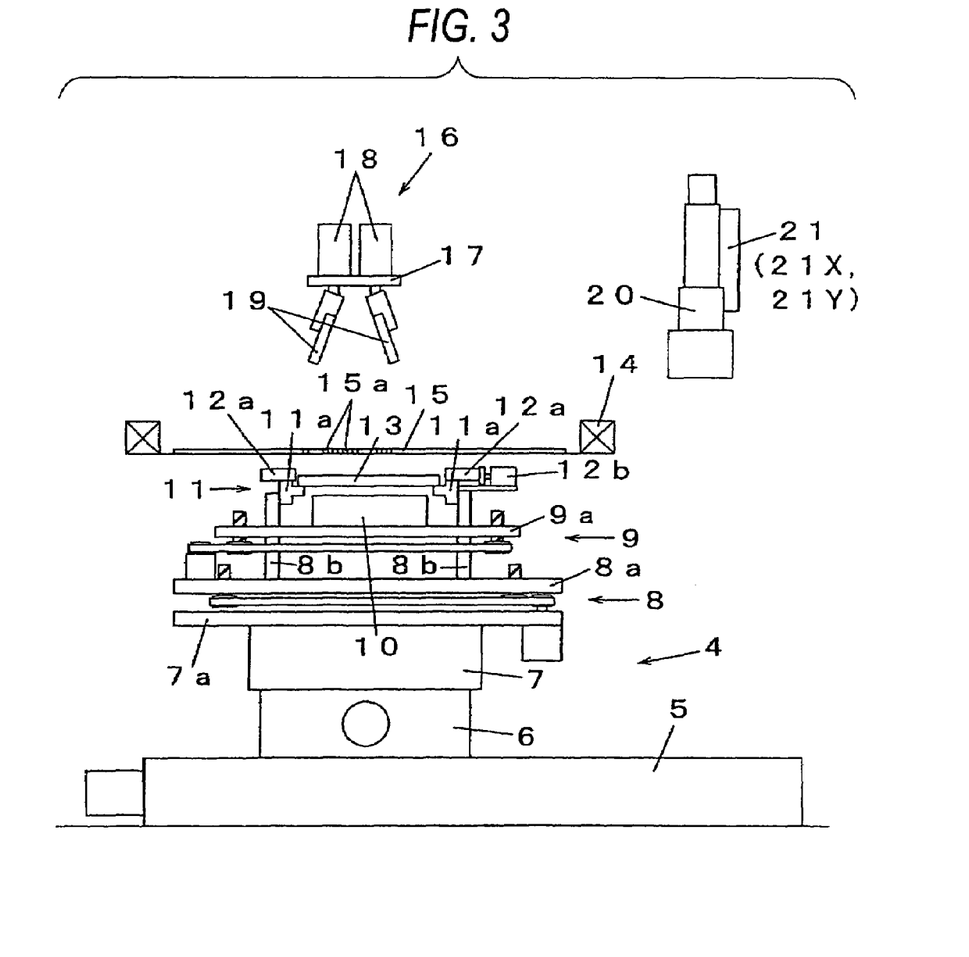
FIG. 3 is a front view illustrating the screen printing apparatus according to the embodiment of the invention.

As shown in FIG. 3, substrate carrying-in rails 11b and substrate carrying-out rails 11c are connected to the upstream side (the left side of FIG. 3) and the downstream side of the carrying rails 11a, respectively. The substrate 13 carried in from the upstream side through the substrate carrying-in rails 11b is put on the carrying rails 11a and is then located by the substrate positioning unit 4. Then, a screen printing mechanism, which will be described later, performs printing on the substrate 13, and the printed substrate 13 is carried out to the downstream side by the substrate carrying-out rails 11c.

Furthermore, a base plate 9a of the second Z-axis table 9 is provided between the substrate transfer mechanism 11 and the base plate 8a such that it can be raised or lowered, and a substrate lifting unit 10 is provided on the upper surface of the base plate 9a. When the second Z-axis table 9 is driven, the substrate lifting unit 10 is raised or lowered with respect to the substrate 13 supported by the carrying rails 11a, so that it supports the substrate 13 with its upper surface coming into contact with the lower surface of the substrate 13. Two clamp members 12a are respectively provided on the upper surfaces of the carrying rails 11a so as to be opposite to each other in the horizontal direction. A driving mechanism 12b moves one clamp member 12 forward or backward to clamp and fix the substrate 13 with the two clamp members.

Next, the screen printing mechanism provided above the substrate positioning unit 4 will be described. In FIGS. 2 and 3, a screen mask 15 is arranged in a mask frame 14, and pattern holes 15a are provided in the screen mask 15, corresponding to a printing target. A squeegee head 16 is arranged above the screen mask 15. The squeegee head 16 is formed by arranging a squeegee raising/lowering mechanism 18 for raising or lowering a squeegee 19 on a flat plate 17. As shown in FIG. 3, the plate 17 is supported by a guide mechanism (not shown) arranged in the Y direction such that it can slide in the Y direction. The plate 17 is horizontally moved in the Y direction by a squeegee shifting unit (not shown), and the squeegee raising/lowering mechanism 18 raises or lowers the squeegee 19 to come into contact with the upper surface of the screen mask 15.

Next, a screen printing operation will be described. First, when the substrate 13 is carried on the carrying rails 11a, the second Z-axis table 9 is driven to raise the substrate lifting unit 10 so that the substrate lifting unit 10 comes into contact with the lower surface of the substrate 13. In this state, the substrate positioning unit 4 is driven to position the substrate 13 with respect to the screen mask 15. Then, the first Z-axis table 8 is driven to raise the substrate 13 together with the carrying rails 11a such that the substrate 13 comes into contact with the lower surface of the screen mask 15, and the substrate 13 is clamped by the clamp members 12a. In this way, the horizontal position of the substrate 13 is fixed when squeegeeing is performed by the squeegee head 16. In this state, when the squeegee 19 slides on the screen mask 15 having cream solder supplied thereon, the cream solder is printed on the substrate 13 through the pattern holes 15a.

Figure 4:
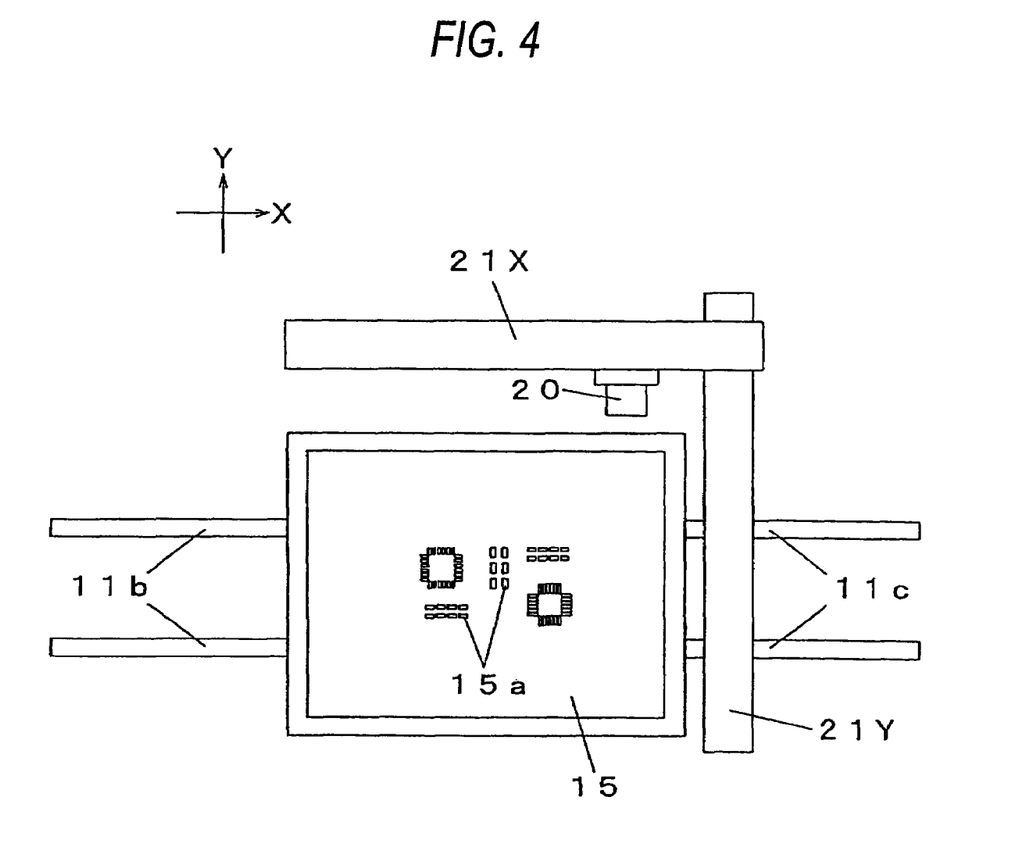
FIG. 4 is a plan view illustrating the screen printing apparatus according to the embodiment of the invention.

Further, a camera 20 is provided above the screen mask 15 such that it can be moved in the horizontal direction by a camera shifting mechanism 21 including an X-axis table 21X and a Y-axis table 21Y (see FIG. 4). As shown in FIG. 2, the driving of the substrate positioning unit 4 makes it possible to position the substrate immediately below the camera 20. Then, when the camera 20 captures an image of the printed substrate 13, image processing is performed on image data obtained from the image of the printed substrate 13 to examine the printed state of the substrate 13. In addition, it is possible to take a picture of the pattern holes 15a by driving the X-axis table 21X and the Y-axis table 21Y to move the camera 20 above the screen mask 15. Then, a process for recognizing image data obtained from the captured image is performed, which makes it possible to calculate mask aperture data indicating the positions of the pattern holes, as will be described later.

Figure 5:
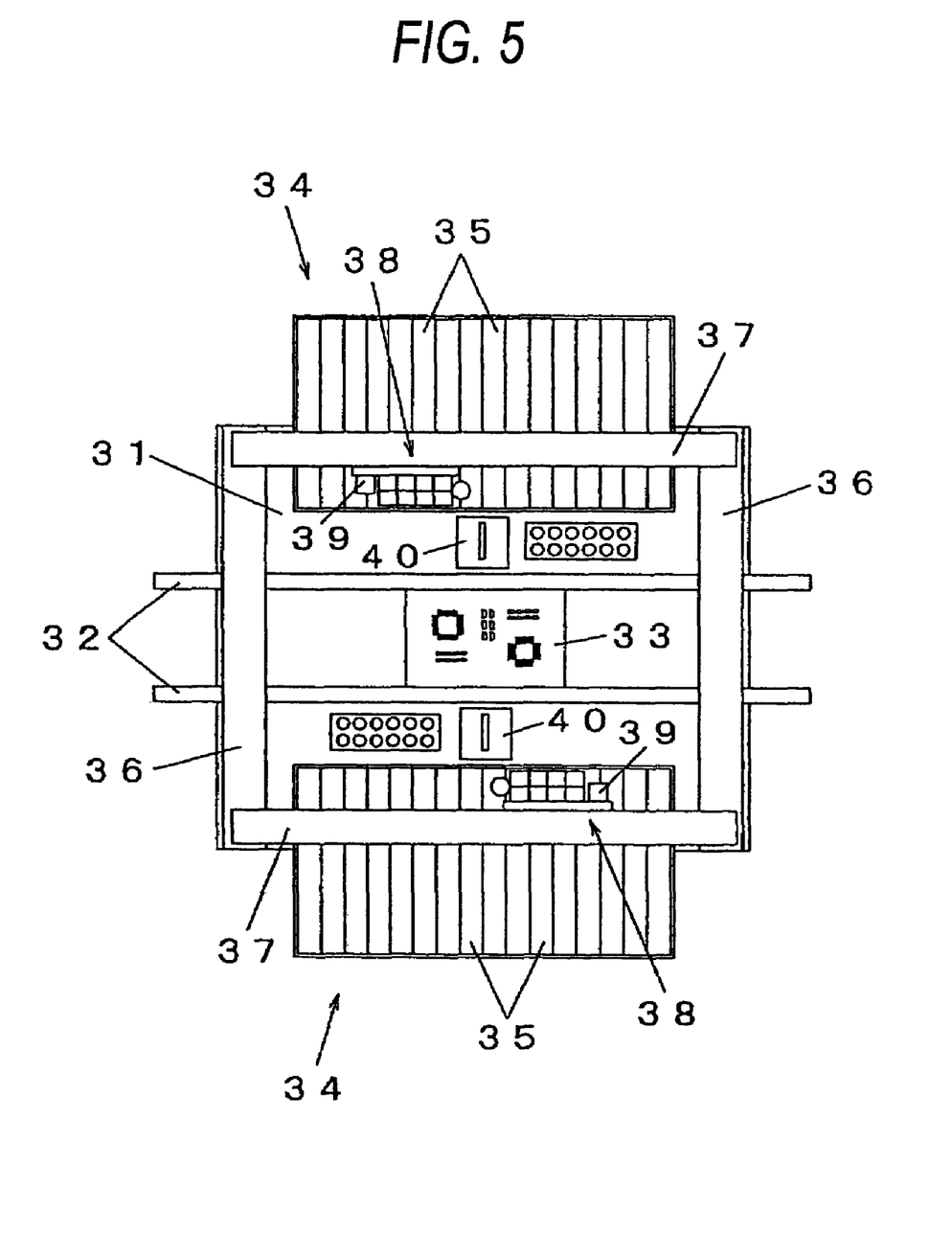
FIG. 5 is a plan view illustrating an electronic component mounting apparatus according to an embodiment of the invention.

Next, the electronic component mounting apparatus will be described with reference to FIG. 5. As shown in FIG. 5, transfer paths 32 are provided on a base 31. The transfer paths 32 transfer a substrate 33 to locate the mounting positions of electronic components. A component supply unit 34 is arranged on the lower side of the transfer path 32 in FIG. 5, and a plurality of tape feeders 35 are arranged parallel to each other in the component supply unit 34. Each tape feeder 35 accommodates an electronic component held on the tape and pitch-transfers the tape, thereby supplying the electronic component.

Further, head driving units each including a Y-axis table 36 and an X-axis table 37 are provided on the base 31, and a mounting head 38 and a substrate recognizing camera 39 integrally shifted with the mounting head 38 are provided on each X-axis table 37. When the head driving unit is driven, the mounting head 38 is horizontally moved to pick up an electronic component from the component supply unit 34 by using an attraction nozzle (not shown) and mounts the electronic component on the substrate 33 located on the transfer paths 32. A first camera 39 positioned above the substrate 33 captures an image of the substrate 33 and recognizes it. In addition, each second camera 40 is provided on a path from the component supply unit 34 to the transfer path 32. The second camera 40 captures an image of the electronic component held by the mounting head 38 below the electronic component.

Figure 6:
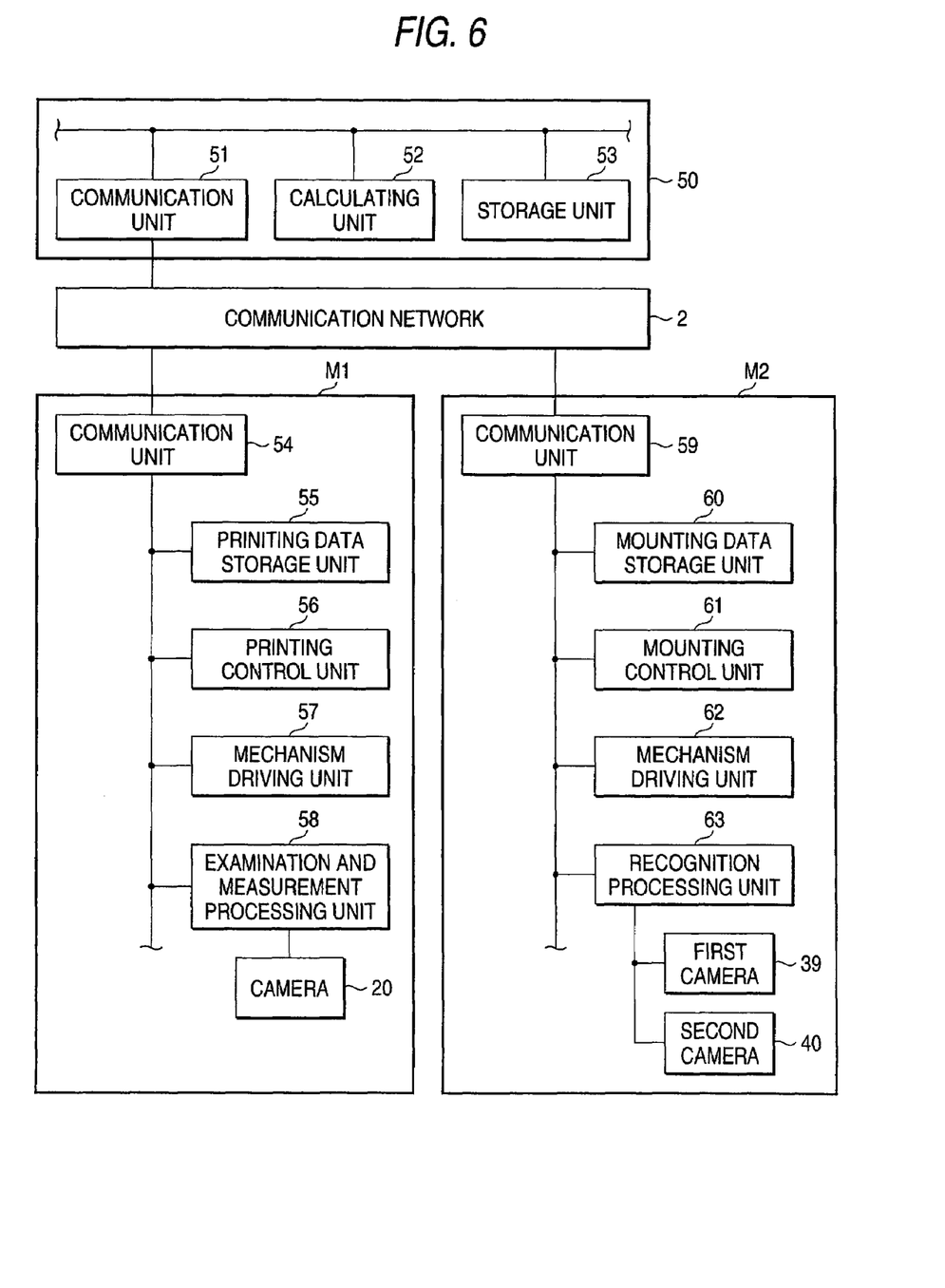
FIG. 6 is a block diagram illustrating a control system of the electronic component mounting apparatus according to the embodiment of the invention.

Next, a description will be made of the structure of a control system for the electronic component mounting system with reference to FIG. 6. In FIG. 6, a general control unit 50 has a function for controlling a mounting operation among the functions of the management computer 3 and includes a communication unit 51, a calculating unit 52, and a storage unit 53. The communication unit 51 serves to transmit or receive data to or from each apparatus over the communication network. The calculating unit 52 is a CPU and performs various processes, such as a process for creating control parameters in the mounting operation.

In this embodiment, as will be described later, the calculating unit 52 calculates component mounting position data of the electronic component mounting apparatus M2, that is, coordinates of a mounting position when an electronic component is mounted on the substrate 33 by the mounting head 38, on the basis of the mask aperture data measured by the screen printing apparatus M1. The storage unit 53 stores data required for the calculation of the calculating unit 52 and the results of the calculation. In the above-mentioned structure, the calculating unit 52 is composed of a coordinate calculating unit for calculating the coordinates of the mounting position when the mounting head mounts an electronic component, on the basis of the mask aperture data. Therefore, in the embodiment, the coordinate calculating unit is provided in the management computer 3 for controlling the electronic component mounting apparatus M2 and the screen printing apparatus M1.

A control device for the screen printing apparatus M1 includes a communication unit 54, a printing data storage unit 55, a printing control unit 56, a mechanism driving unit 57, and an examination and measurement processing unit 58. The communication unit 54 transmits or receives data to or from other apparatuses over the communication network 2. The printing data storage unit 55 stores control parameters required for a printing operation. The printing control unit 56 controls the printing operation of the screen printing apparatus, on the basis of the stored control parameters and a control instruction transmitted from the general control unit 50.

The mechanism driving unit 57 drives various units, such as the substrate positioning unit and the screen printing control mechanism. The examination and measurement processing unit 58 examines the printed state of the substrate after solder printing, on the basis of the image captured by the camera 20 after printing. In addition, the examination and measurement processing unit 58 performs an aperture position measuring process for detecting the position of the mask aperture, on the basis of the image of the mask screen captured by the camera 20 and outputs the processed results as the mask aperture data.

The camera 20 and the examination and measurement processing unit 58 serves as a mask aperture measuring unit for measuring the aperture position of the pattern holes arranged in the mask screen and for outputting the measured results as the mask aperture data. Therefore, in this embodiment, the mask aperture measuring unit provided in the screen printing apparatus M1 additionally has a solder examination function for examining the state of the solder after printing.

A control device for the electronic component mounting apparatus M2 includes a communication unit 59, a mounting data storage unit 60, a mounting control unit 61, a mechanism driving unit 62, and a recognition processing unit 63. The communication unit 59 transmits or receives data to or from other apparatuses over the communication network 2. The mounting data storage unit 60 stores control parameters required for a component mounting operation. The mounting control unit 61 controls the mounting operation of the electronic component mounting apparatus, on the basis of the stored control parameters and a control instruction transmitted from the general control unit 50. The mechanism driving unit 62 drives various units, such as a substrate transfer system and a component mounting mechanism. The recognition processing unit 63 recognizes the position of a substrate, on the basis of an image captured by the first camera 39, and recognizes an electronic component held by the mounting head, on the basis of an image captured by the second camera 40.

Further, when the calculating unit 52 of the management computer 3 does not have a calculating function for creating component mounting position data, the electronic component mounting apparatus receives the solder printing position data and creates the component mounting position date by using the mounting control unit 61. In this case, the mounting control unit 61 serves as a coordinate calculating unit for calculating the coordinates of a mounting position in the component mounting operation performed by the mounting head, on the basis of the mask aperture data. Therefore, in this case, the coordinate calculating unit is provided in the control device of the electronic component mounting apparatus M1.

Figure 7:
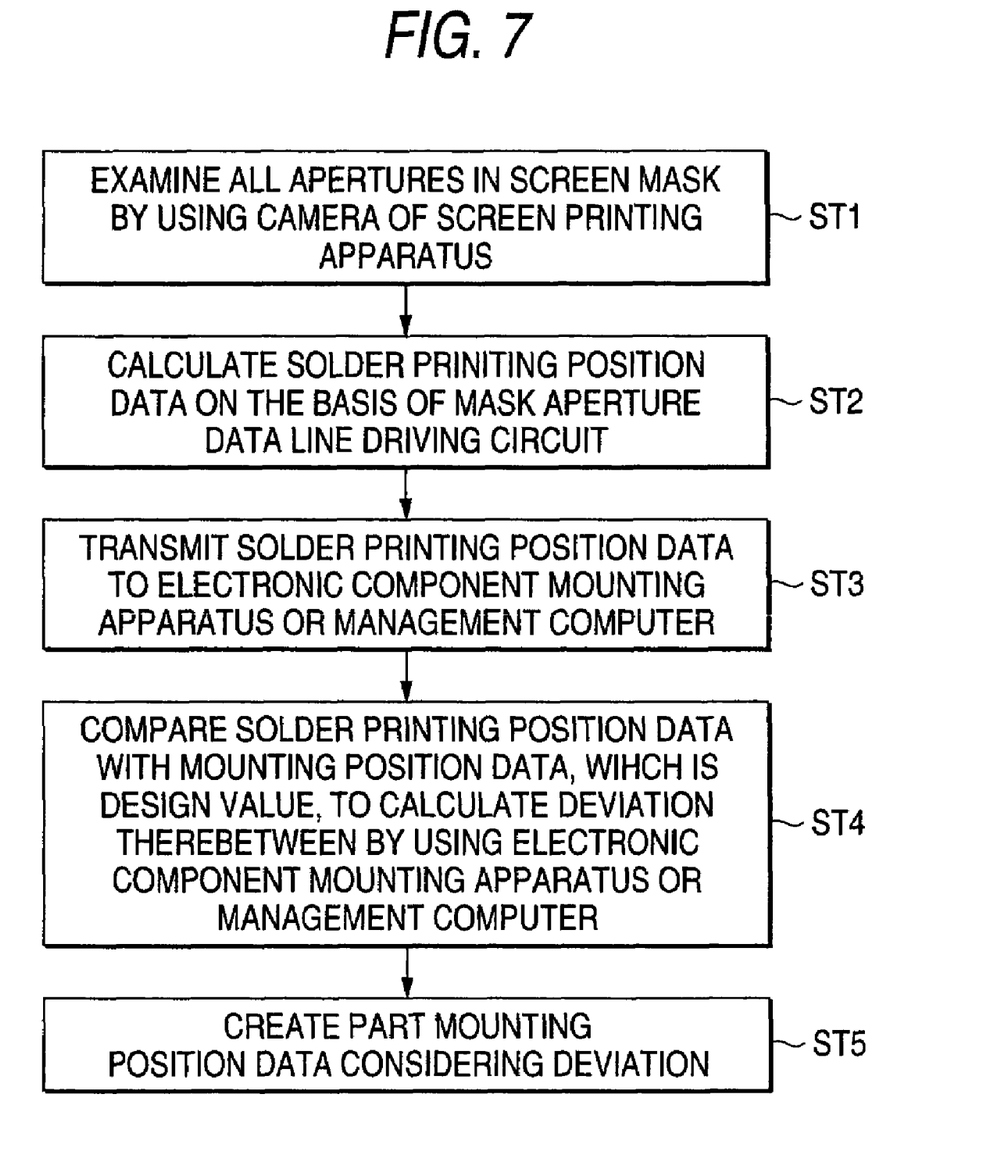
FIG. 7 is a flow chart illustrating a process for creating mounting data in a method of mounting electronic components according to an embodiment of the invention.

Next, a description will be made below of a process for creating the component mounting position data along a flow chart shown in FIG. 7 which is performed when the electronic component mounting system having the above-mentioned structure mounts electronic components, with reference to the drawings. First, when a new type of substrate is mounted, a new screen mask 15 corresponding to the substrate is mounted on the screen printing apparatus M1. After the mask is mounted, all the apertures provided in the screen mask 15 are examined by means of the camera 20 of the screen printing apparatus M1.

Figure 8A:
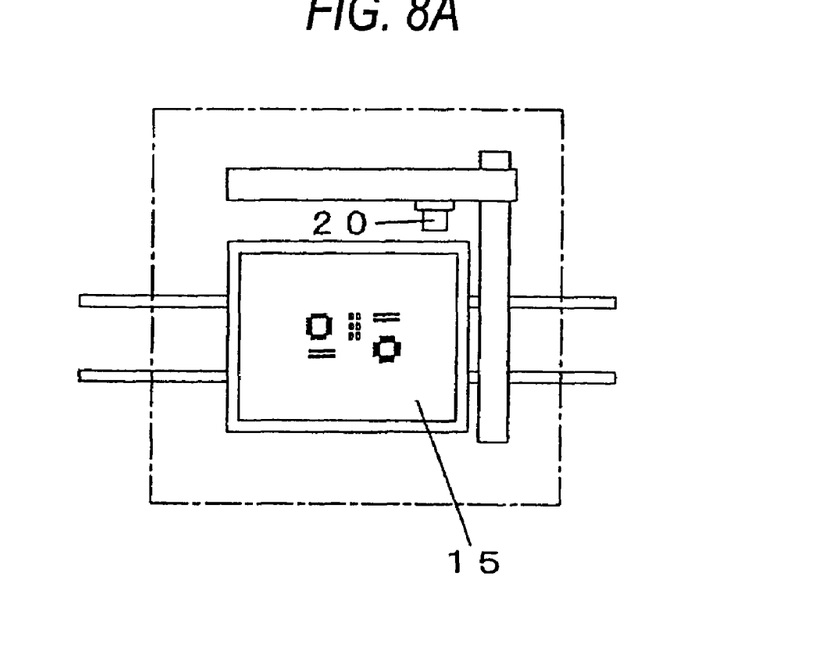
FIGS. 8A and 8B are process charts illustrating the method of mounting electronic components according to the embodiment of the invention.
Figure 8B:
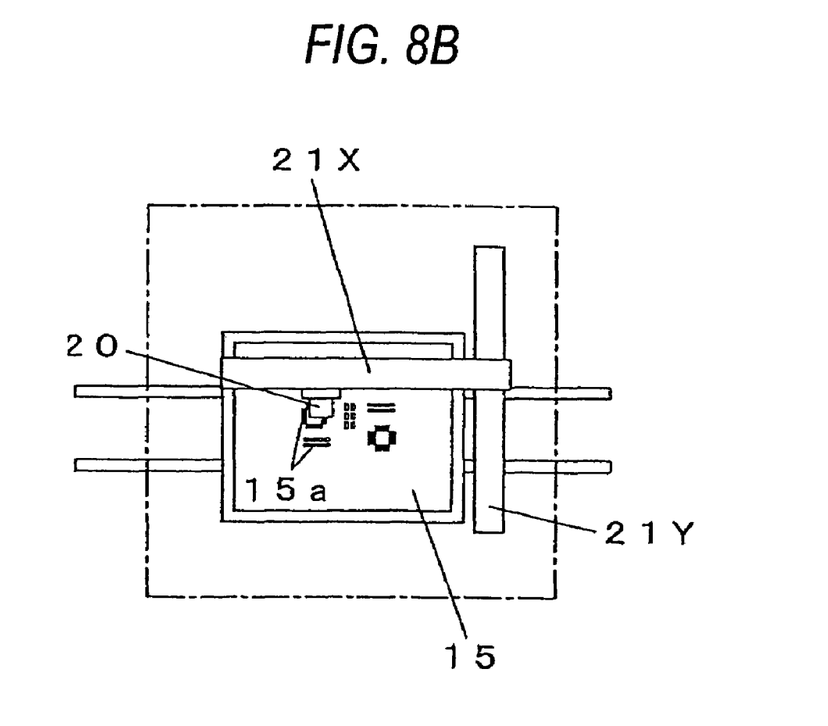
Figure 9A:
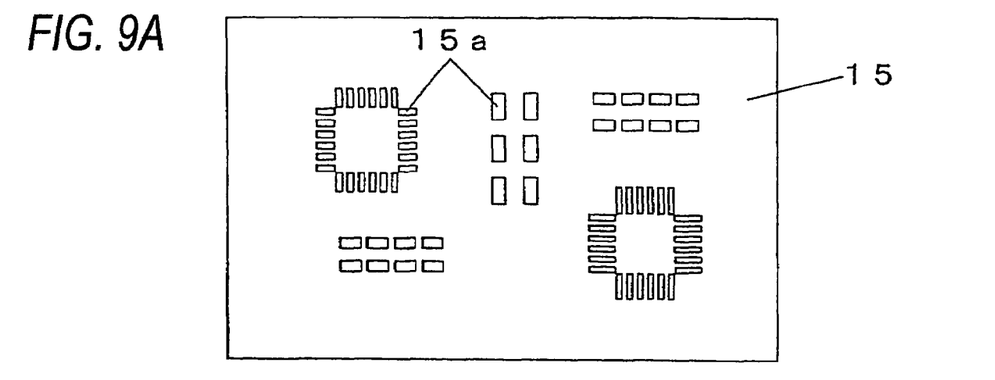
FIGS. 9A to 9C are process charts illustrating the method of mounting electronic components according to the embodiment of the invention.

That is, as shown in FIGS. 8A and 8B, the X-axis table 21X and the Y-axis table 21Y are driven to move the camera 20 above the screen mask 15 to sequentially capture images of pattern holes 15a shown in FIG. 9A. Then, the examination and measurement processing unit 58 processes the captured images to measure the positions of the pattern holes 15a and outputs the measured results as mask aperture data (ST1).

Then, solder printing position data is calculated on the basis of the output mask aperture data. That is, the positions of the pattern holes 15a provided in the screen mask 15 are regarded as the positions of the solder printed on the substrate 13, and the positional coordinates of each pattern hole in the mask aperture data are considered as the positional coordinates of the printed solder. Then, the solder printing position data is transmitted to the electronic component mounting apparatus or the management computer (ST3).

Subsequently, the electronic component mounting apparatus M2 or the management computer 3 compares the solder printing position data with mounting position data, which is a design value, to calculate the amount of deviation therebetween (ST4). Then, the electronic component mounting apparatus M2 or the management computer 3 creates component mounting position data considering the amount of deviation (ST5). That is, the electronic component mounting apparatus or the management computer performs a coordinate calculating process. After that, the created component mounting position data is stored in the mounting data storage unit 60 of the electronic component mounting apparatus M2.

Figure 9B:
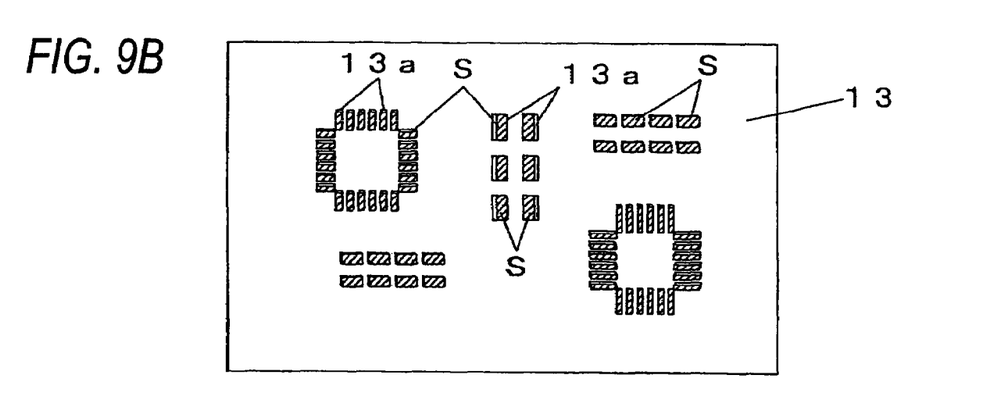

Thereafter, an operation for mounting electronic components on the substrate 13 is performed. That is, the substrate 13 is carried in the screen printing apparatus M1, and cream solder S is printed on electrodes 13a formed on the substrate 13 through the pattern holes 15a of the screen mask 15. At that time, the cream solder S is not necessarily printed at predetermined positions on the electrodes 13a due to a relative positional deviation between the pattern holes 15a provided in the screen mask 15 and the electrodes 13a of the substrate 13. For example, as shown in FIG. 9B, the cream solder S may be printed so as to deviate from the electrodes 13a.

Figure 9C:
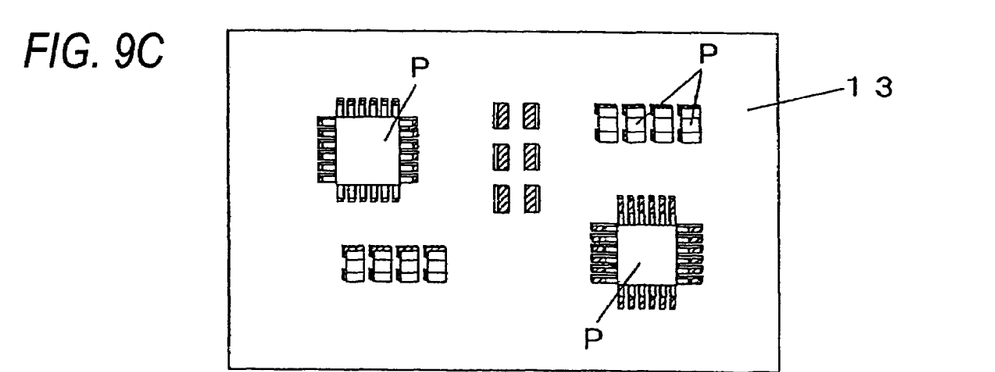

Then, the substrate 13 having the solder printed thereon is carried in the electronic component mounting apparatus, and the operation for mounting electronic components on the substrate 13 is performed. In the component mounting operation, the mounting head 38 is moved, on the basis of the component mounting position data created in step ST5, and electronic components P are mounted at predetermined mounting positions. Since the component mounting position data used for this process is updated, considering the above-mentioned positional deviation of the cream solder S, the electronic components P are accurately mounted at the positions of the solder S printed on the electrodes 13a, as shown in FIG. 9C. In this way, when the solder S is melt in a subsequent reflow process, the electronic components P are accurately bonded to the electrodes 13a by the self alignment effect of the melt solder.

That is, according to an aspect of the invention, it is provided an electronic component mounting method of mounting electronic components on a substrate by means of soldering by using an electronic component mounting system having a screen printing apparatus and an electronic component mounting apparatus connected to each other to manufacture a mounting substrate. The electronic component mounting method includes: a screen printing process for printing solder on the electronic component connecting electrodes 13a formed on the substrate 13 through the pattern holes 15a by bringing the screen mask 15 having the pattern holes 15a provided therein into contact with the substrate 13, by supplying paste on the screen mask 15, and by sliding a squeegee thereon; and an electronic component mounting process for picking up electronic components from the component supply unit by using the mounting head 38 and for mounting the electronic components on the substrate 13 having the solder printed thereon.

Then, in the electronic component mounting method, the following processes are performed prior to a screen printing process: a mask aperture measuring process for measuring the positions of the pattern holes 15a provided in the screen mask and for outputting the measured positions as mask aperture data; and a coordinate calculating process for calculating the coordinates of a mounting position in the component mounting operation of the mounting head 38, on the basis of the mask aperture data. In addition, a mask aperture measuring process is performed by a solder examination function included in the screen printing apparatus M1.

As described above, in this embodiment, unlike a conventional method of measuring the position of solder after the solder is printed as in a conventional method, positions calculated by measuring the positions of the pattern holes provided in the screen mask are regarded as the positions of the solder actually printed on the substrate. That is, in this embodiment, prior to the screen printing process, the positions of the pattern holes provided in the screen mask are measured to calculate mask aperture data, and the coordinates of a mounting position in the component mounting operation of the mounding head are calculated on the basis of the mask aperture data.

In this way, it is possible to calculate the positional deviation of solder, without measuring the position of solder after printing whenever the solder is printed, and to mount electronic components in the component mounting operation, considering the positional deviation of solder. As a result, it is possible to accurately mount electronic components on the solder printed on the substrate and thus to prevent defects in mounting due to the positional deviation of solder, which results in high productivity.

This application is based upon and claims the benefit of priority of Japanese Patent Application No. 2005-037154 filed on Feb. 15, 2005, the contents of which are incorporated herein by reference in its entirety.

INDUSTRIAL APPLICABILITY

An electronic component mounting system of the invention is capable of preventing defects in mounting due to the positional deviation of solder and of achieving high productivity. Thus, the electronic component mounting system can be applied to an electronic component mounting line for mounting electronic components on solder printed on a substrate to manufacture a mounting substrate.

The invention claimed is:

1. An electronic component mounting system for mounting electronic components on a substrate by means of soldering to manufacture a mounting substrate, comprising:
  a screen printing apparatus which prints solder on electronic component connecting electrodes which are provided on the substrate, through pattern holes provided in a screen mask, by bringing the screen mask into contact with the substrate, by supplying paste on the screen mask, and by sliding a squeegee thereon;
  an electronic component mounting apparatus which picks up the electronic components from a component supply unit by using a mounting head and mounts them on the substrate having the solder printed thereon;
  a mask aperture measuring unit which measures the positions of the pattern holes provided in the screen mask and outputs the measured positions as mask aperture data; and
  a coordinate calculating unit which calculates coordinates of mounting positions on the basis of the mask aperture data, the coordinates of mounting position being used when the mounting head mounts the electronic components,
  wherein the mask aperture unit measures the positions of the pattern holes before the screen printing apparatus printing solder the electronic component connecting electrodes, and further wherein the coordinate calculating unit calculates the coordinates of mounting positions before the screen printing apparatus printing solder on the electronic component connecting electrode.

2. The electronic component mounting system according to claim 1,
  wherein the mask aperture measuring unit provided in the screen printing apparatus has a solder examination function for examining the state of the solder after printing.

3. The electronic component mounting system according to claim 1,
  wherein the coordinate calculating unit is provided in a control device of the electronic component mounting apparatus.

4. The electronic component mounting system according to claim 1,
  wherein the coordinate calculating unit is provided in a management computer for controlling the electronic component mounting apparatus and the screen printing apparatus.

5. An electronic component mounting method which mounts electronic components on a substrate by means of soldering to manufacture a mounting substrate by using an electronic component mounting system, comprising:

- a screen printing step of printing solder on electronic component connecting electrodes which are provided on the substrate, through pattern holes provided in a screen mask, by bringing the screen mask into contact with the substrate, by supplying paste on the screen mask, and by sliding a squeegee thereon;
- an electronic component mounting step of picking up the electronic components from a component supply unit by using a mounting head to mount them on the substrate having the solder printed thereon;
- a mask aperture measuring step of measuring the positions of the pattern holes provided in the screen mask and of outputting the measured positions as mask aperture data; and
- a coordinate calculating step of calculating coordinates of mounting positions on the basis of the mask aperture data, the coordinates of mounting position being used when the mounting head mounts the electronic components, wherein the mask aperture measuring step and the coordinate calculating step are performed prior to the screen printing step.

6. The electronic component mounting method according to claim 5, wherein the mask aperture measuring step is performed by a solder examination function for examining the state of the solder after printing which is included in a screen printing apparatus.

7. The electronic component mounting method according to claim 5, wherein the coordinate calculating step is performed by a control device of the electronic component mounting apparatus.

8. The electronic component mounting method according to claim 5, wherein the coordinate calculating step is performed by a management computer for controlling the electronic component mounting apparatus and a screen printing apparatus.

* * * * *